United States Patent
Lee

(10) Patent No.: US 6,285,549 B1
(45) Date of Patent: Sep. 4, 2001

(54) POWER PACKAGE LEAD FRAME

(75) Inventor: Teng Yul Lee, Seoul (KR)

(73) Assignee: Auk Co., Ltd., Chonbuk (KR)

( * ) Notice: Subject to any disclaimer, the term of this patent is extended or adjusted under 35 U.S.C. 154(b) by 0 days.

(21) Appl. No.: 09/475,021

(22) Filed: Dec. 30, 1999

(30) Foreign Application Priority Data

Aug. 27, 1999 (KR) .................................................. 99-17988

(51) Int. Cl.$^7$ ....................................................... H05K 7/20
(52) U.S. Cl. .................. 361/704; 165/80.2; 165/80.3; 165/185; 257/675; 257/796; 361/723; 174/16.3
(58) Field of Search ................................. 165/80.2, 80.3, 165/185; 174/16.3, 52.2; 257/707, 713, 747, 675, 796; 361/704, 707, 717–719, 722–723, 776, 813, 822

(56) References Cited

U.S. PATENT DOCUMENTS

| | | | |
|---|---|---|---|
| 4,451,973 | * | 6/1984 | Tateno et al. ......................... 257/796 |
| 4,675,718 | * | 6/1987 | Tsubokura et al. ................... 257/713 |
| 5,049,973 | * | 9/1991 | Satriano et al. ...................... 357/713 |
| 5,309,027 | * | 5/1994 | Letterman, Jr. ....................... 257/796 |
| 5,675,182 | * | 10/1997 | Moscicki ............................... 257/796 |

* cited by examiner

Primary Examiner—Gregory Thompson
(74) Attorney, Agent, or Firm—Lowe Hauptman Gilman & Berner, LLP

(57) ABSTRACT

A power package lead frame comprises a lead frame, a chip attached to the lead frame, and a mold encasing the chip and a portion of the lead frame. The lead frame comprises a paddle part, a radiation plate, and a leg part. The radiation plate comprises a first plate extending from the paddle part and a second plate extending from the first plate. The first and second plates have the same thickness as the paddle part or the leg part. The second plate is folded towards the first plate and fixed tightly thereto, so that the radiation plate is twice as thick as the paddle part or the leg part.

3 Claims, 6 Drawing Sheets

POWER PACKAGE LEAD FRAME

TECHNICAL FIELD OF THE DEVICE

The present device relates to a power package lead frame, or more particularly to a power package lead frame with the reduction of material costs, while maintaining the conventional radiating effect.

BACKGROUND ART

FIG. 6 is a front view for showing the conventional structure of a lead frame and FIG. 7 is a side view of FIG. 6. There, a lead frame (101), a chip (103), and a mold (105) encasing part of the lead frame (101) and the chip (103), are shown.

With respect to the lead frame (101), a leg part (101a) extends at one side of the mold (105) for installing the same to a printed circuit board (not shown), and a radiation plate (101b) is provided at the other side of the mold in order to radiate the heat from the chip (103) to the outside.

Further, the center part of the radiation plate (101i) is provided with a hole (101c) for connecting to an external radiator (not shown).

In the power package lead frame constructed as above, the thickness (t) of the leg part(101a) and the thickness (T) of the radiation plate (101b) are made with different thickness at the time of manufacturing of the lead frame in order to maximize the radiation effect of the radiation plate (101b). The thickness (T) of the radiation plate (101b) is made thicker than the thickness (t) of the leg (101a). In order to maximize the radiation effect for radiating the heat generated from the chip to the outside, a conventional lead frame was made by using expensive lead frames of different thickness, which was problematic in terms of an increase in manufacturing costs.

SUMMARY OF THE DEVICE

Accordingly, the present device is designed to solve the aforementioned problem, and the objective of the present device is to provide a power package lead frame with the reduction of material costs, while maintaining the effect of a radiation plate radiating the heat generated from the chip to the outside.

To accomplish this objective, the present device is a power package lead frame comprising a lead frame having a paddle part, a radiation plate and a leg part; a chip joined to the paddle part of said lead frame; and a mold encasing said chip and a part of the leg part and the paddle part of the lead frame, wherein the radiation plate of the lead frame comprises a first plate extending from the paddle part, having the same thickness as the paddle part and the leg part, and a second plate extending from the first plate, with the same thickness as the first plate, said second plate being folded towards the first plate, superposing tightly thereto, in such a manner that the radiation plate is twice as thick as the thickness of the paddle part or the leg part.

DETAILED DESCRIPTION OF THE EXEMPLARY EMBODIMENTS

Hereinafter, a preferred embodiment of the present device will be explained in detail with the accompanying drawings.

Figure 1:
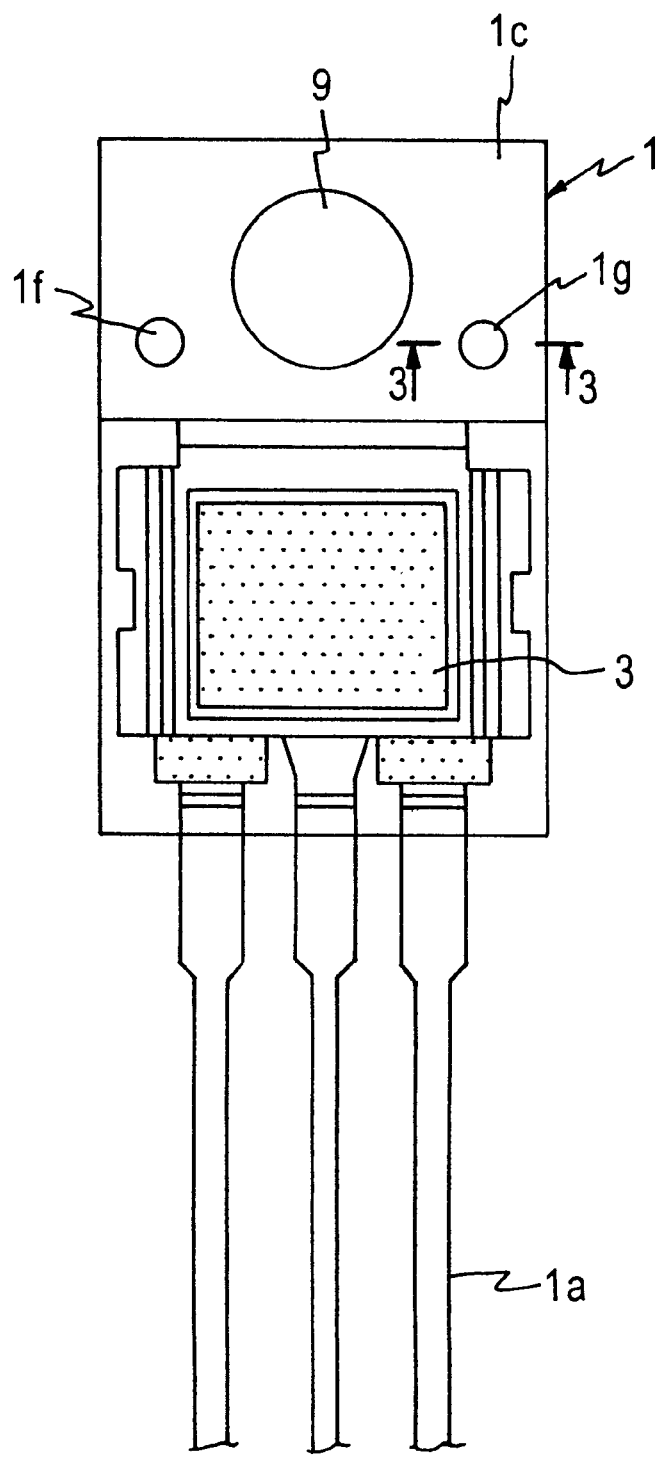
FIG. 1 is a front view of an embodiment of the present device.
Figure 2:
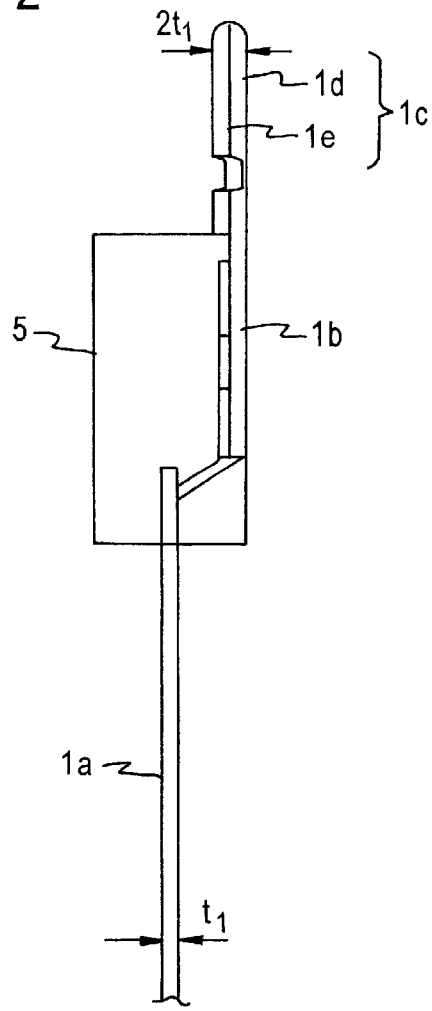
FIG. 2 is a side view of FIG. 1.

FIG. 1 is a plane view, which shows the embodiment according to the present device, and FIG. 2 is a side view of FIG. 1, showing a lead frame (1) and a chip (3).

Figure 4:
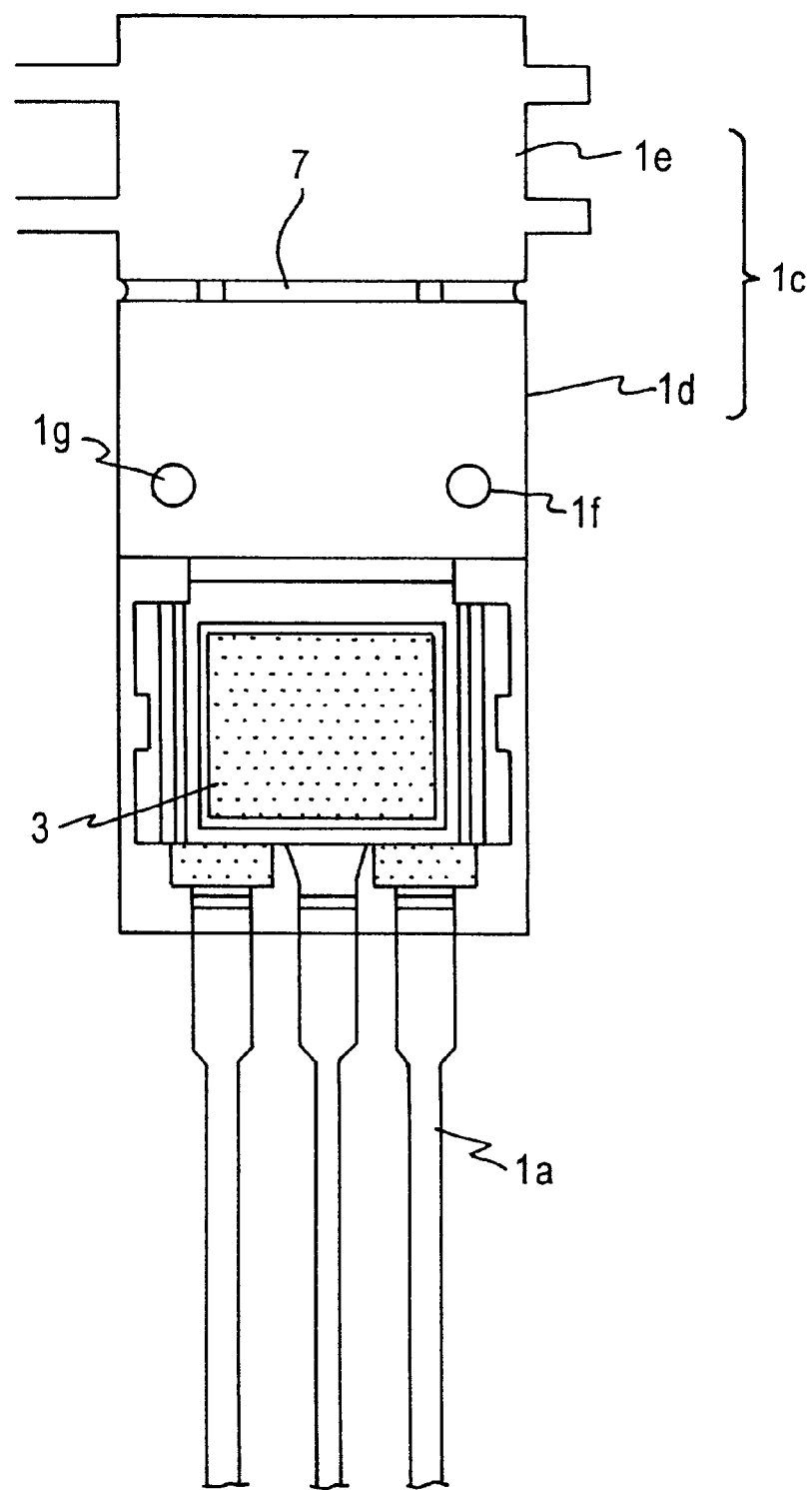
FIG. 4 is a front view which illustrates the formation process of the lead frame.
Figure 5:
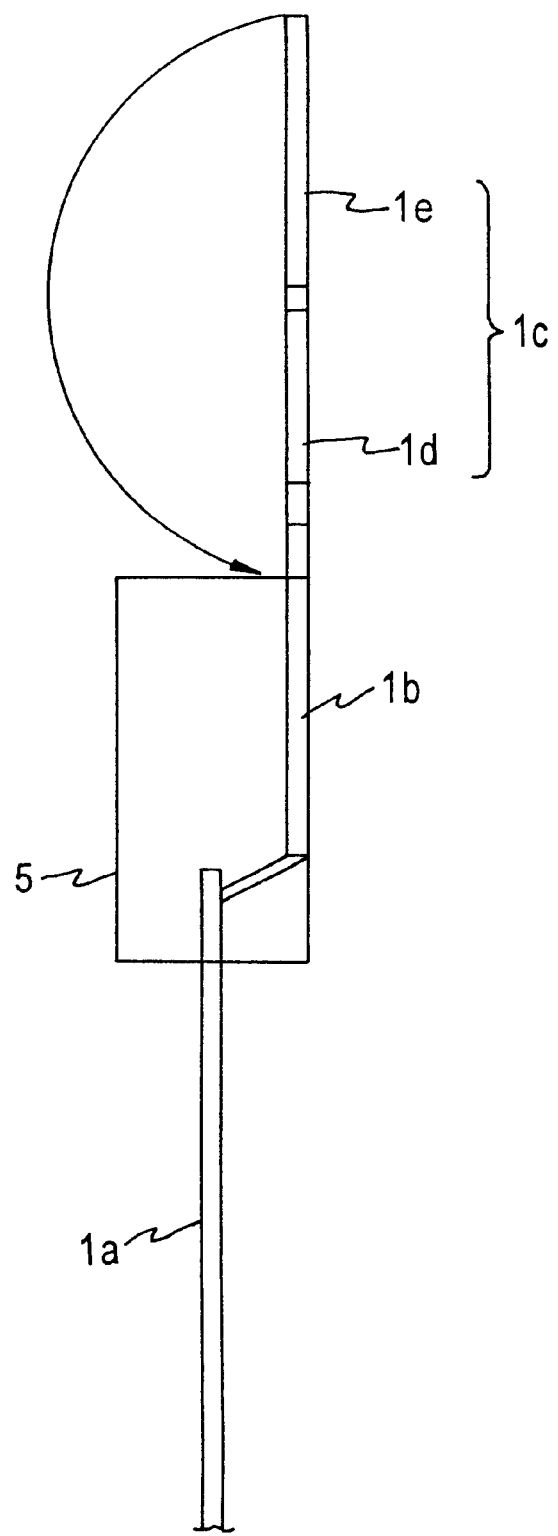
FIG. 5 is a side view of FIG. 4.
Figure 6:
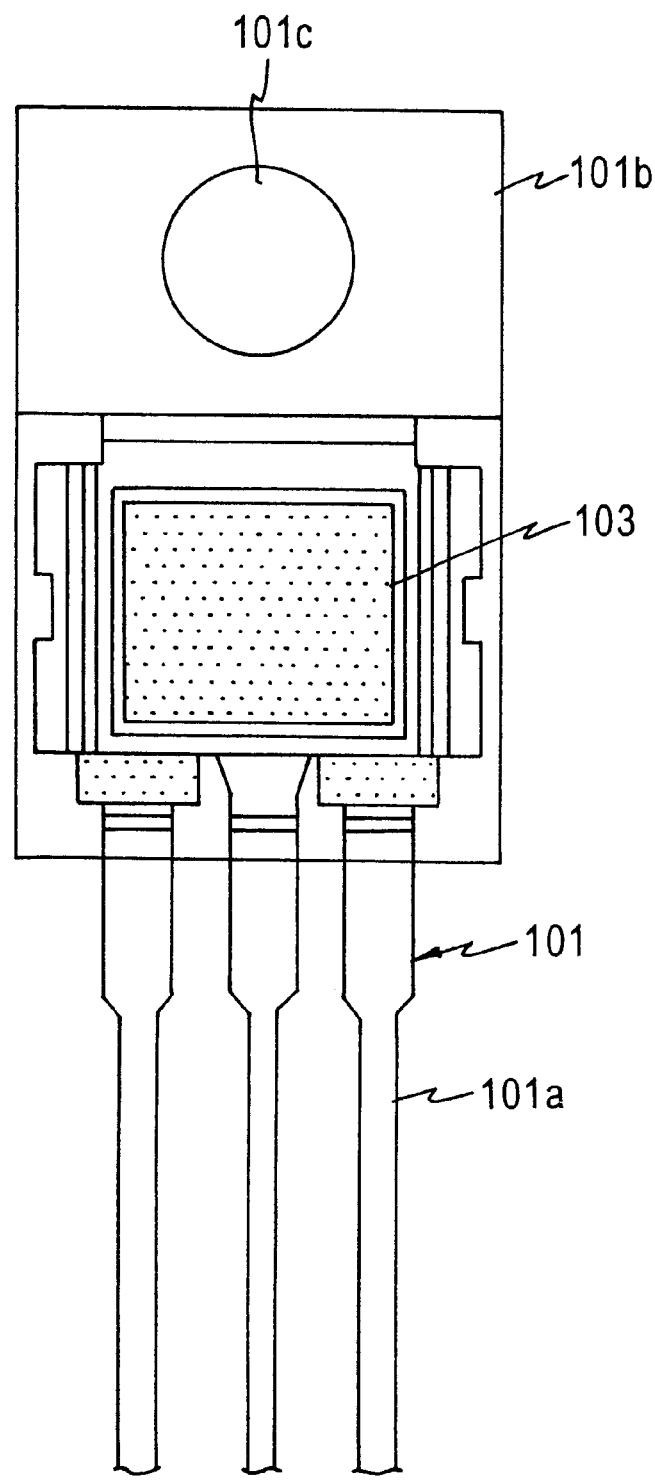
FIG. 6 is a front view, which shows the conventional structure of a lead frame.
Figure 7:
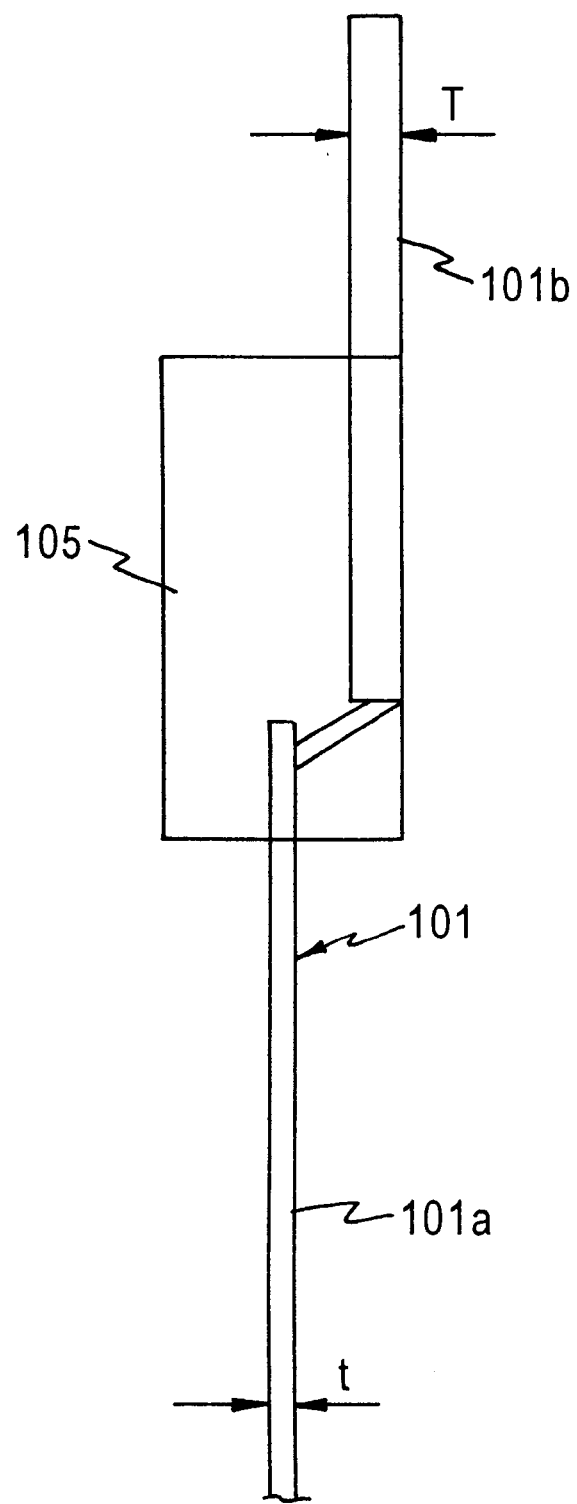
FIG. 7 is a side view of FIG. 6.

The lead frame (1) comprises a leg part (1a), a paddle part (1b) to which a chip (3) is connected, and a radiation plate (1c) for radiating the heat generating from the chip (3) to the outside. The radiation plate (1c) comprises a first plate (1d) extending from the paddle part (1b), and a second plate (1e) extending from the first plate (1d) (shown in FIG. 4 and FIG. 5).

Further, a connection point between the first plate (1d) and the second plate (1c) is provided with a foldable part (7) having a long groove for facilitating the folding in one direction. The first plate (1d) is provided with at least one fixation hole (1f, 1g). The fixation holes (1f, 1g) are for tightly pressing the first plate and the second plate (1d, 1e) against each other by using a pressing means, thereby fixing the plates to each other.

The leg part (1a), the paddle part (1b) and the first and the second plates (1d, 1e) are of the same thickness. As shown above, the lead frame (1) used in the present device is manufactured by using the plates having uniform thickness.

Figure 3:
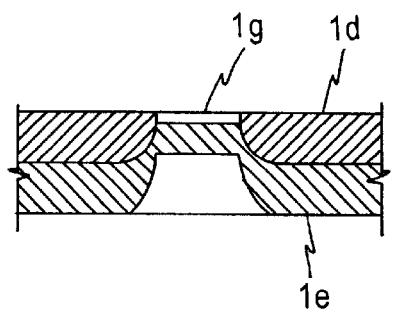
FIG. 3 is a cross-sectional view along the line A–A' of FIG. 1.

As for the lead frame (1), the chip (3) is connected to the paddle part (1b) for fixation, and then the second plate (1e) is folded (in the direction of an arrow in FIG. 5) with respect to the foldable part (7) for tightly superposing the same to the first plate (1d). Further, the one side of the second plate (1e) corresponding to the fixation holes (1f, 1g) of the first plate (1d) is pressed by using a pressing means and consequently is transformed and inserted into the fixation holes (1f, 1g) of the first plate (1d), thereby fixating the first plate (1d) and the second plate (1e)(shown in FIG. 3).

Further, for manufacturing a semiconductor component assembly, the paddle part (1b), a portion of the leg part (1a), and chip (3) are molded by means of resins for sealing. An unexplained reference number 5 shows a mold.

A mold formation process can be implemented in the different order depending on the manufacturing process of the semiconductor chip component. Then, a hole for connecting (9) to an external radiator is bored through the radiation plate (1c). The hole for connecting (9) to the external radiator is formed by the conventional method, except that the first and the second plates (1d, 1e) are bored at the same time in the embodiment according to the present device, As shown above, the radiation plate (1c) according to the present device is twice ($2t_1$) as thick as the thickness ($t_1$) of the leg part (1a) or the paddle part (1b). The present device is of the same thickness of the conventional radiation plate and uses inexpensive plates of uniform thickness as constituent materials, thereby maintaining the same radiation effect and reducing the material costs.

As explained above, in the power package lead frame of the present device, a lead frame is made by using a general plate for lead frames, having a uniform thickness, thereby reducing the material costs, and the part of the radiation plate is folded into two layers in such a way that it is twice as thick as the other parts, thereby satisfying the conditions of the conventional radiation plate, while maintaining the same radiating effect at lesser costs.

What is claimed is:

1. A power package lead frame comprising:

a lead frame having a paddle part, a radiation plate, and a leg part;

a chip connected to the paddle part of said lead frame; and a mold encasing said chip and a portion of the leg part and the paddle part of said lead frame, wherein the radiation plate of said lead frame comprises a first plate extending from the paddle part and having the same thickness as the paddle part or the leg part, and a second plate extending from the first plate and having the same thickness as the first plate; and the second plate is folded towards the first plate, superposing tightly thereto, so that the radiation plate is twice as thick as the paddle part or the leg part.

2. A power package lead frame according to claim 1, wherein one side of the first plate of the radiation plate has at least one fixation hole and a portion of the second plate, corresponding to said at least one fixation hole when the second plate is folded towards the first plate, is pressed into said at least one fixation hole, deformed and tightly received within said at least one fixation hole, so that the first plate and the second plate are fixated as a single unit.

3. A power package lead frame according to claim 1, wherein the first plate and the second plate are folded and fixed together to form the radiation plate, and a hole for connecting to an external radiator is formed through the first and second plates of the radiation plate.

* * * * *